(12) United States Patent
Dougherty et al.

(10) Patent No.: US 7,541,972 B1
(45) Date of Patent: Jun. 2, 2009

(54) RF ATTENUATION CIRCUIT

(75) Inventors: John Dougherty, Liverpool, NY (US); John Wiley, Marietta, NY (US); Greg Kliss, Syracuse, NY (US)

(73) Assignee: SRC, Inc., North Syracuse, NY (US)

( * ) Notice: Subject to any disclaimer, the term of this patent is extended or adjusted under 35 U.S.C. 154(b) by 33 days.

(21) Appl. No.: 11/952,482

(22) Filed: Dec. 7, 2007

(51) Int. Cl.
G01S 7/285 (2006.01)
(52) U.S. Cl. .......................... 342/175; 342/89; 342/92
(58) Field of Classification Search ................ 342/175, 342/20, 82–93
See application file for complete search history.

(56) References Cited

U.S. PATENT DOCUMENTS

| | | | |
|---|---|---|---|
| 4,359,735 A * | 11/1982 | Lewis et al. ................ 342/194 |
| 5,245,347 A | 9/1993 | Bonta et al. | |
| 5,930,695 A | 7/1999 | Yamaguchi et al. | |
| 6,191,725 B1 | 2/2001 | Lavoie | |
| 6,272,327 B1 | 8/2001 | Kurchuk et al. | |
| 6,496,017 B2 | 12/2002 | Bhat | |
| 6,571,110 B1 | 5/2003 | Patton et al. | |
| 6,636,567 B1 | 10/2003 | Roberts et al. | |
| 6,680,692 B2 | 1/2004 | Solbach | |
| 6,690,317 B2 | 2/2004 | Szeto et al. | |
| 6,879,281 B2 | 4/2005 | Gresham et al. | |
| 6,911,931 B2 | 6/2005 | Vincent | |
| 7,088,794 B2 | 8/2006 | Nichols | |
| 2003/0071752 A1 | 4/2003 | Miyoshi et al. | |
| 2003/0117310 A1 | 6/2003 | Kikuchi et al. | |
| 2003/0199264 A1 * | 10/2003 | Holenstein et al. .......... 455/324 |
| 2005/0104767 A1 | 5/2005 | Kirby et al. | |
| 2005/0111524 A1 | 5/2005 | Baker et al. | |
| 2005/0141605 A1 | 6/2005 | Akahori et al. | |
| 2005/0270219 A1 | 12/2005 | Dwelly et al. | |

FOREIGN PATENT DOCUMENTS

| | | | |
|---|---|---|---|
| JP | 02027285 A | * | 1/1990 |
| JP | 02055978 A | * | 2/1990 |
| JP | 04116486 A | * | 4/1992 |
| JP | 06082547 A | * | 3/1994 |
| JP | 06281722 | | 7/1994 |

OTHER PUBLICATIONS

Filtronic Signal Solutions—Microwave Subsystems Solutions, Frequency Memory Loops, http://www.filss.com/subsyst/fml.shtml, Jan. 26, 2006.

* cited by examiner

*Primary Examiner*—John B Sotomayor
(74) *Attorney, Agent, or Firm*—George R. McGuire; David Woycechowski; Bond, Schoeneck & King, PLLC

(57) ABSTRACT

An RF receiving circuit that selectively attenuates a received RF signal before it reaches sensitive modifying devices, such as a low noise amplifier or an analog to digital converter. The receiving circuit includes a delay element upstream of its attenuator so that high energy pulses of a short duration (for example, less than 10 nanoseconds) can be effectively attenuated despite coupler, detector, threshold and/or switch delays of the attenuation related circuitry.

20 Claims, 1 Drawing Sheet

RF ATTENUATION CIRCUIT

FEDERALLY SPONSORED RESEARCH OR DEVELOPMENT

Not applicable.

BACKGROUND OF THE INVENTION

1. Field of the Invention

The present invention relates to circuits for converting received radio frequency signals ("RF signal", see definitions section) signal into modified signals (see Definitions section) and more particularly to radar receiver circuitry for converting received radar RF signals into modified signals useful in generating radar information.

2. Description of the Related Art

It is conventional to convert radio waves into electrical RF signals. Radios, radar, cell phones and other wireless communication systems all do this. It is conventional to convert RF signals into modified RF signals by the use of modifying devices. One example of this is when a received RF signal is processed by a low noise amplifier modifying device. Another example of this is when an RF signal is processed by a modifying device into an intermediate frequency ("IF") electrical signal. A couple of conventional circuits for processing RF signals will now be discussed.

U.S. Pat. No. 6,191,725 ("Lavoie") at FIG. 1 ("FIG. 1 Lavoie") discloses an automatic gain control circuit for electromagnetic wave receiving systems, such as radar warning receivers. In FIG. 1 Lavoie, a radar pulse is received, presumably as an RF signal (Lavoie does not disclose this part of the FIG. 1 Lavoie system in detail). The RF signal is converted to an IF signal, presumably by modifying it with a low noise amplifier ("LNA") and/or other appropriate modifying device(s) (again, Lavoie does not disclose this part of the FIG. 1 Lavoie system in detail). The converted IF signal of Lavoie then passes through an analog delay line to a fast programmable attenuator, and then to an amplifier. The fast programmable attenuator of FIG. 1 Lavoie is controlled by control circuitry based on a comparison of amplitude of the received IF signal to an appropriate reference level. The analog delay line provides the programmable attenuator with time to settle. It is noted that the programmable attenuator of FIG. 1 Lavoie does not provide protection to circuit components upstream of the programmable attenuator, such as the modifying device(s) that would be required for FIG. 1 Lavoie to convert a received RF pulse into a corresponding IF pulse. Also, the programmable attenuator of FIG. 1 Lavoie attenuates solely on the basis of the amplitude of the IF signal, and does not account for the frequency or duration of a pulse present in the IF signal.

U.S. Pat. No. 7,088,794 ("Nichols") discloses an automatic gain control RF signal processor for receiver systems, such as radar intercept receivers. As shown at FIGS. 1 and 2 of Nichols, in the Nichols circuitry, an electrical signal passes through the following devices in the following order: (i) any modifying device(s) necessary to convert the received RF signal into an analog IF input signal (see left hand side of FIG. 1 of Nichols); (ii) an attenuator; (iii) a fixed amplifier; (iv) a bandpass filter; (v) an analog to digital converter; and (vi) a digital delay. The digital delay is used so that the front edge of the signal is not missed due to latency in the decision-making process within the threshold and control logic. It is noted that the delayed portion of the signal that passes through the digital delay is not attenuated after it has been delayed because the attenuator is upstream of the delay in the Nichols circuitry. It is further noted that the modifying device(s) needed to converted the RF signal presumably received in Nichols into the analog input signal shown at the left side of FIG. 1 in Nichols are not protected by the attenuator of Nichols because these devices would be upstream of the attenuator and therefore not subject to the signal attenuation it provides.

Description Of the Related Art Section Disclaimer: To the extent that specific publications are discussed above in this Description of the Related Art Section, these discussions should not be taken as an admission that the discussed publications (for example, published patents) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Description of the Related Art Section, they are all hereby incorporated by reference into this document in their respective entirety(ies).

BRIEF SUMMARY OF THE INVENTION

The present invention is directed to a circuit where an RF signal first passes through a delay circuit and then passes through a power reducing device ("PRD", see Definitions section) before it passes through any modifying devices. Some embodiments of the present invention are more specifically directed to a circuit where an RF signal first passes through a delay circuit and then passes through a power reducing device before it passes through an RF signal to IF signal conversion device (see definitions section). Some embodiments of the present invention are more specifically directed to a circuit where an RF signal first passes through a delay circuit and then passes through a power reducing device before it passes through a low noise amplifier (see definitions section). Some embodiments of the present invention are adapted for RF signals at frequencies above several hundred MHz. Some embodiments of the present invention are adapted for RF signals with short pulse widths of less than 10 nanoseconds.

In some embodiments of the present invention, the power reducing circuitry is characterized by a response time and the delay of the delay circuit is approximately equal to the response time of the power reducing circuitry. In some embodiments of the present invention, the power reducing circuitry includes RF switches, an RC network, a tunnel diode detector and a coupler.

Various embodiments of the present invention may exhibit one or more of the following objects, features and/or advantages:

(i) useful in a radar receiver that uses very large pulses of energy, such as through the wall radar;

(ii) useful in a radar receiver that uses very short pulses of energy;

(iii) prevents damage to radar receiver circuitry, such as low noise amplifiers;

(iv) improves performance of radar receiver circuitry;

(v) dramatically attenuates powerful, unwanted signals;

(vi) prevents analog to digital converter saturation;

(vi) prevents damage to the front end of a wideband or ultra wideband radar or communication system receiver;

(vii) circuitry potentially has other uses in the fields of medical imaging, optics, diagnostic electronics and/or measurement electronics;

(viii) reduces the magnitude of very short duration (for example, less than 10 nanosecond), high energy received pulses;

(ix) performs a high speed limiting function at high frequency above several hundred Mhz; and (x) limits amplitude of an RF signal so that it is within the designed amplitude range of relatively inexpensive RF signal processing components (for example, amplifiers and analog to digital converters).

According to one aspect of the present invention, an RF receiver circuit includes an antenna, a delay element, a PRD and a modifying device. The antenna is adapted to produce an RF signal in response to electromagnetic waves. The delay element is directly electrically connected (see definitions section) to the antenna so that the delay element receives and delays the RF signal from the antenna. The PRD is electrically connected to the delay element so that the PRD receives the delayed RF signal from the delay element and selectively reduces the power of the RF signal. The modifying device is electrically connected to the PRD so that the modifying device receives the RF signal from the PRD.

According to a further aspect of the present invention, an RF receiver circuit includes an antenna, a delay element, an RF switch, an RF switch controller a coupler and a modifying device. The antenna is adapted to produce an RF signal in response to electromagnetic waves. The delay element is directly electrically connected to the antenna so that the delay element receives and delays the RF signal from the antenna. The RF switch is electrically connected to the delay element so that the RF switch receives the delayed RF signal from the delay element and selectively attenuates the RF signal. The RF switch controller is electrically connected to the antenna and is adapted to control the attenuation operation of the RF switch based on the power of the RF signal received from the antenna. The RF switch controller includes a tunnel diode detector and a resistor. The tunnel diode detector and the resistor are electrically connected in parallel. The coupler is adapted and connected to electrically connect the RF switch controller to the antenna so that the RF switch controller receives the RF signal from the antenna. The modifying device is electrically connected to the RF switch so that the modifying device receives the attenuated RF signal from the RF switch.

According to a further aspect of the present invention, radar device includes an RF radiation source, an antenna, a delay element, an RF switch, an RF switch controller, a coupler and an LNA. The RF radiation source is adapted to generate electromagnetic radar waves having a pulse time of less than 10 nanoseconds and a frequency of greater than 300 MHz. The antenna is adapted and located to receive the radar waves and to produce an RF signal in response to the electromagnetic waves. The delay element is directly electrically connected to the antenna so that the delay element receives and delays the RF signal from the antenna. The RF switch is electrically connected to the delay element so that the RF switch receives the delayed RF signal from the delay element and selectively attenuates the RF signal. The RF switch controller is electrically connected to said antenna and adapted to control the attenuation operation of the RF switch based on the power of the RF signal received from the antenna. The RF switch controller includes a tunnel diode detector, a resistor, a first capacitor, a second capacitor and an RF switch controller amplifier. The resistor and the tunnel diode detector are electrically connected in parallel. The first capacitor is connected in parallel with both the resistor and the tunnel diode detector. The second capacitor is connected in series with the resistor and in parallel with the tunnel diode detector. The coupler is adapted and connected to electrically connect the RF switch controller to the antenna so that the RF switch controller receives the RF signal from the antenna. The LNA is electrically connected to the RF switch so that the LNA device receives the attenuated RF signal from the RF switch.

BRIEF DESCRIPTION OF THE DRAWINGS

The present invention will be more fully understood and appreciated by reading the following Detailed Description in conjunction with the accompanying drawings, in which.

DETAILED DESCRIPTION OF THE INVENTION

Figure 1:
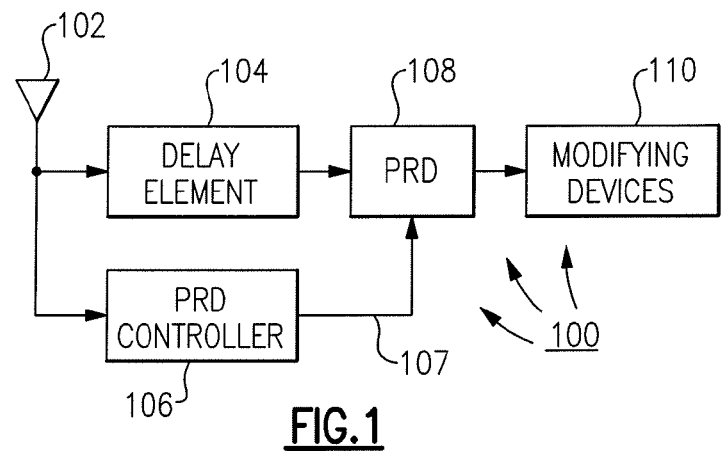
FIG. 1 is a schematic of a circuit according to a first embodiment of the present invention.

FIG. 1 shows an RF receiver circuit 100 including antenna 102; delay element 104; PRD controller 106; PRD 108; and modifying devices 110. The antenna may be any type of antenna now known or to be developed in the future for converting RF electromagnetic waves into an RF signal. The RF signal generated by the antenna is sent to the delay element and the PRD controller. The delay element may be any type of circuitry for delaying a signal now known or to be developed in the future. The PRD controller may be hardware and/or software based. The PRD controller sends a control signal 107 to the PRD based on the amount of power in the RF signal. If the RF signal is sufficiently powerful, then the PRD controller will control the PRD to reduce the power of the RF signal. The PRD controller is characterized by a PRD controller delay.

The PRD may be any type of PRD now known or to be developed in the future. The PRD is characterized by a PRD delay. A total delay is the sum of the PRD controller delay and the PRD delay. The delay element should be designed to delay the RF signal for a time period approximately equal to the total delay. Because the PRD receives the RF signal from the delay element on a delayed basis it can respond in time to reduce the power of the RF signal before it communicates the RF signal to the modifying devices. In this way, RF receiver circuit 100 protects the modifying devices from degraded performance and/or damage.

Figure 2:
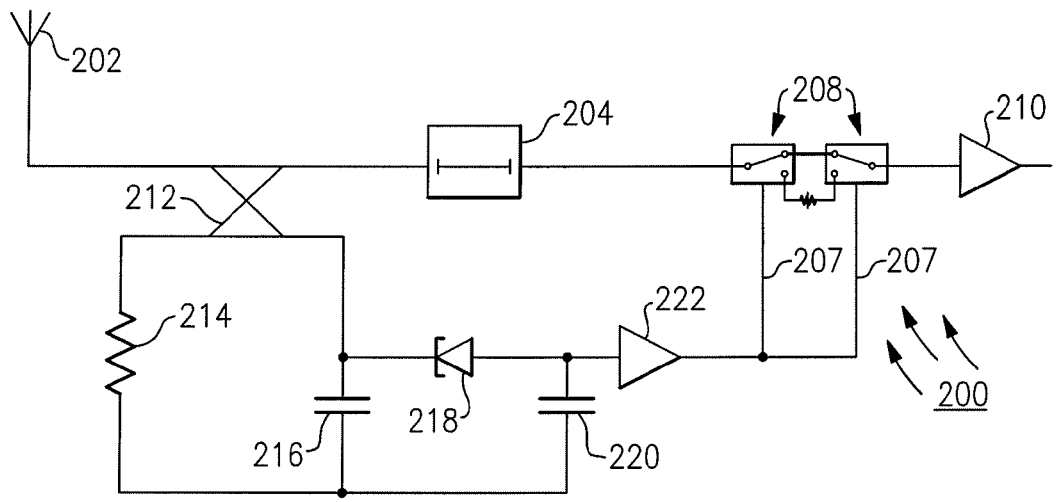
FIG. 2 is a schematic of a circuit according to a second embodiment of the present invention.

FIG. 2 shows a preferred RF receiver circuit 200 including antenna 202; delay element 204; RF switches 208; LNA 10; coupler 212; resistor 214; capacitor 216; tunnel diode detector ("detector diode") 218; capacitor 220; and RF switch controller amplifier ("comparator amp") 222.

The coupler preferably provides adequate isolation from the input pulse so that the maximum power level seen by the detector diode is within its input operating range.

The delay element is preferably a transmission line, delay filter and/or similar device. The delay element is preferably chosen so that incoming pulses are delayed long enough to provide sufficient time for the processing components to react, especially the comparator amp, the tunnel diode detector, and the RF switches.

The capacitors and resistor used in this circuit are selected to match the characteristic impedance of the upstream signals. The resistance value for the resistor is preferably the characteristic impedance of the antenna and transmission line. For most typical systems, this would be 50 ohms. The preferred capacitor values depend on the characteristics of the detector diode selected. These values are preferably selected so that the total impedance of the network made up by the detector diode and the two capacitors would be the same as the impedance of the resistor (normally 50 ohms).

The RF switches selectively switch on and off to selectively attenuate portions of the RF signal that are sufficiently high in power such that they would otherwise damage the LNA and/or other modifying devices in the radar receiver. The resistor and capacitors form an RC network. The coupler, RC network, tunnel diode detector and RF switch controller amplifier work together to control the RF switches to switch on and off and selectively attenuate the RF signal by control signal 207.

The coupler, RC network, tunnel diode detector and comparator amp characterized by a controller delay. The RF switches are characterized by an RF switch delay. The total delay is the sum of the controller delay and the RF switch delay. The delay element should be designed to delay the RF signal for a time period approximately equal to the total delay.

Because the RF switches receive the RF signal from the delay element on a delayed basis they can respond in time to reduce the power of the RF signal before it communicates the RF signal to the modifying devices. For example, in circuit 200 the delay element delays the RF signal for approximately 5 nanoseconds. This is an appropriate value for radar receiver systems with short (for example, less than 10 nanosecond) received pulses having high energy and operating frequencies of several hundred MHz or more. The 5 nanosecond delay means that little or none of the high energy pulse will be passed to the LNA and/or other modifying devices before the RF switches can responds by attenuating the high power RF signal down to a level consistent with good performance and prevention of component damage.

Now the reasons that preferred circuits according to the present invention can perform effectively at operating frequencies of several hundred MHz and above. Conventional limiting circuits generally rely on a single solid state limiter device (usually a Schottky or Pin-Diode). These devices passively detect and then attenuate RF signals above a set power level, but they all take some time to react. For this reason, very short pulses (less than a few nanoseconds) are able to pass right through before the device can begin attenuating. On the other hand, preferred circuits according to the present invention are able to stop these pulses by coupling off some of the power at the input, detect the existence of a high power pulse with a detector diode (which doesn't need to attenuate the signal but instead has to only trigger the comparator, so it can operate much faster than a limiter) and trigger the comparator amplifier which activates a high speed RF switch that will attenuate the signal path before the high speed pulse has had a chance to pass through the delay line. If the power level is beneath the threshold of the detector diode, the RF switch would not be activated and therefore the signal would come out of the delay line and pass through the circuit untouched. Simply put, the input pulse is being delayed while the detector circuit decides if the switches should be thrown or not.

If the switches need to be thrown, the delay line affords the processing circuit a chance to react before the pulse reaches the output. This circuit will work at all RF frequencies (assuming the components are selected to handle the frequencies of interest). Due to the physics of the problem, pulses this short in duration can not exist at frequencies below several hundred MHz.

DEFINITIONS

The following definitions are provided to facilitate claim interpretation and claim construction:

Present invention: means at least some embodiments of the present invention; references to various feature(s) of the "present invention" throughout this document do not mean that all claimed embodiments or methods include the referenced feature(s).

First, second, third, etc. ("ordinals"): Unless otherwise noted, ordinals only serve to distinguish or identify (e.g., various members of a group); the mere use of ordinals implies neither a consecutive numerical limit nor a serial limitation.

Electrically connected: means either directly electrically connected, or indirectly electrically connected, such that intervening elements are present; in an indirect electrical connection, the intervening elements may include inductors and/or transformers.

Directly electrically connected: electrically connected without any intervening elements that substantially change the electrical characteristics of the electrical energy and/or signal passing between the directly electrically connected elements.

RF signal: any electrical signal having a frequency or rate of oscillation such that it could produce and or have been generated by radio waves in an electromagnetic field; the range of radio frequencies for electromagnetic fields extends through at least the range of 3 Hz to 300 GHz; some modified signals (see Definition of "modified signal") may also be considered as RF signals depending primarily upon whether the frequency of the modified signal.

Modified signal: an RF signal that has been modified in some way by a modifying device to make it more useful.

Modifying device: any circuitry that makes an RF signal into a modified signal, including, but not necessarily limited to, amplifiers, low noise amplifiers, filters, RF signal to IF signal converters and/or mixers; generally speaking, modifying devices can suffer degraded performance or even damage if subjected to an RF input signal having too much power.

Power reducing device ("PRD"): any device that can decreases the power of an RF pulse, including, but not necessarily limited to limiters and/or attenuators.

To the extent that the definitions provided above are consistent with ordinary, plain, and accustomed meanings (as generally shown by documents such as dictionaries and/or technical lexicons), the above definitions shall be considered supplemental in nature. To the extent that the definitions provided above are inconsistent with ordinary, plain, and accustomed meanings (as generally shown by documents such as dictionaries and/or technical lexicons), the above definitions shall control. If the definitions provided above are broader than the ordinary, plain, and accustomed meanings in some aspect, then the above definitions shall be considered to broaden the claim accordingly.

To the extent that a patentee may act as its own lexicographer under applicable law, it is hereby further directed that all words appearing in the claims section, except for the above-defined words, shall take on their ordinary, plain, and accustomed meanings (as generally shown by documents such as dictionaries and/or technical lexicons), and shall not be considered to be specially defined in this specification. In the situation where a word or term used in the claims has more than one alternative ordinary, plain and accustomed meaning, the broadest definition that is consistent with technological feasibility and not directly inconsistent with the specification shall control.

Unless otherwise explicitly provided in the claim language, steps in method steps or process claims need only be performed in the same time order as the order the steps are recited in the claim only to the extent that impossibility or extreme feasibility problems dictate that the recited step order (or portion of the recited step order) be used. This broad interpretation with respect to step order is to be used regardless of whether the alternative time ordering(s) of the claimed steps is particularly mentioned or discussed in this document.

What is claimed is:

1. An RF receiver circuit comprising:
   an antenna adapted to produce an RF signal in response to electromagnetic waves;
   a delay element directly electrically connected to said antenna so that said delay element receives and delays the RF signal from said antenna;
   a PRD electrically connected to said delay element so that said PRD receives the delayed RF signal from said delay element and selectively reduces the power of the RF signal; and
   a modifying device electrically connected to said PRD so that said modifying device receives the RF signal from said PRD.

2. The circuit of claim 1 further comprising a PRD controller electrically connected to said antenna and adapted to control the power reduction operation of said PRD based on the power of the RF signal received from said antenna.

3. The circuit of claim 2 wherein:
   said PRD is characterized by a PRD delay;
   said PRD controller is characterized by a PRD controller delay; and
   the delay caused by said delay element is approximately equal to the sum of the PRD delay and the PRD controller delay.

4. The circuit of claim 2 wherein said PRD comprises RF switches.

5. The circuit of claim 4 wherein said PRD controller comprises a tunnel diode detector and an RF switch controller amplifier.

6. The circuit of claim 2 wherein said PRD controller comprises a coupler and is electrically connected to the antenna through the coupler.

7. The circuit of claim 1 wherein said modifying device is an LNA.

8. The circuit of claim 1 wherein said modifying device is an analog to digital converter.

9. An RF receiver circuit comprising:
   an antenna adapted to produce an RF signal in response to electromagnetic waves;
   a delay element directly electrically connected to said antenna so that said delay element receives and delays the RF signal from said antenna;
   at least one RF switch(es) electrically connected to said delay element so that said RF switch(es) receive the delayed RF signal from said delay element and selectively attenuate the RF signal;
   an RF switch controller electrically connected to said antenna and adapted to control the attenuation operation of said RF switch(es) based on the power of the RF signal received from said antenna, with said RF switch controller comprising a tunnel diode detector and a resistor, with said tunnel diode detector and said resistor being electrically connected in parallel;
   a coupler adapted and connected to electrically connect said RF switch controller to the antenna so that said RF switch controller receives the RF signal from said antenna; and
   a modifying device electrically connected to said RF switches so that said modifying device receives the attenuated RF signal from said RF switches.

10. The circuit of claim 9 wherein said RF switch controller further comprises a capacitor connected in parallel with both said resistor and said tunnel diode detector.

11. The circuit of claim 9 wherein said RF switch controller further comprises a capacitor connected in series with said resistor and in parallel with said tunnel diode detector.

12. The circuit of claim 9 wherein said RF switch controller further comprises an RF switch controller amplifier.

13. The circuit of claim 9 wherein:
   said RF switches are characterized by an RF switch delay;
   said RF switch controller and said coupler are characterized by an RF switch controller delay; and
   the delay caused by the delay element is approximately equal to a sum of the RF switch delay and the RF switch controller delay.

14. The circuit of claim 9 wherein the delay element comprises a transmission line.

15. The circuit of claim 9 wherein said delay element comprises a delay filter.

16. The circuit of claim 9 wherein said delay element is adapted to cause a delay of less than 10 nanoseconds.

17. The circuit according to claim 9 further comprising an RF radiation source located and adapted to generate the electromagnetic waves received by the antenna.

18. The circuit of claim 17 wherein said RF radiation source generates the RF radiation in the form of pulses of less than 10 nanoseconds in duration.

19. The circuit of claim 9 wherein the RF signal has a frequency of greater than 300 MHz.

20. A radar device comprising:
   an RF radiation source adapted to generate electromagnetic radar waves having a pulse time of less than 10 nanoseconds and a frequency of greater than 300 MHz;
   an antenna adapted and located to receive the radar waves and to produce an RF signal in response to the electromagnetic waves;
   a delay element directly electrically connected to said antenna so that said delay element receives and delays the RF signal from said antenna;
   at least one RF switch(es) electrically connected to said delay element so that said RF switch(es) receive the delayed RF signal from said delay element and selectively attenuate the RF signal;
   an RF switch controller electrically connected to said antenna and adapted to control the attenuation operation of said RF switch(es) based on the power of the RF signal received from said antenna, with said RF switch controller comprising:
     a tunnel diode detector,
     a resistor, with said tunnel diode detector and said resistor being electrically connected in parallel,
   a first capacitor connected in parallel with both said resistor and said tunnel diode detector,
     a second capacitor connected in series with said resistor and in parallel with said tunnel diode detector, and
     an RF switch controller amplifier;
   a coupler adapted and connected to electrically connect said RF switch controller to the antenna so that said RF switch controller receives the RF signal from said antenna; and
   an LNA electrically connected to said RF switches so that said LNA device receives the attenuated RF signal from said RF switches.

* * * * *